United States Patent
Su et al.

(10) Patent No.: US 10,091,907 B2
(45) Date of Patent: Oct. 2, 2018

(54) ELECTRONIC ASSEMBLY

(71) Applicants: Chien-Ming Su, Taipei (TW); Chang-Yuan Wu, Taipei (TW); I-Feng Hsu, Taipei (TW); Jen-Chang Chen, Taipei (TW)

(72) Inventors: Chien-Ming Su, Taipei (TW); Chang-Yuan Wu, Taipei (TW); I-Feng Hsu, Taipei (TW); Jen-Chang Chen, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 15/808,825

(22) Filed: Nov. 9, 2017

(65) Prior Publication Data
US 2018/0184546 A1    Jun. 28, 2018

Related U.S. Application Data

(60) Provisional application No. 62/439,470, filed on Dec. 28, 2016.

(51) Int. Cl.
*H05K 7/20* (2006.01)
*G06F 1/20* (2006.01)

(52) U.S. Cl.
CPC ......... *H05K 7/20154* (2013.01); *G06F 1/203* (2013.01); *H05K 7/2029* (2013.01); *H05K 7/20145* (2013.01)

(58) Field of Classification Search
CPC ........... H05K 7/20154; H05K 7/20145; H05K 7/2029; H05K 7/20136; H05K 7/20181; H05K 7/202; G06F 1/203
See application file for complete search history.

(56) References Cited

U.S. PATENT DOCUMENTS

| | | | | |
|---|---|---|---|---|
| 6,094,347 A * | 7/2000 | Bhatia | ............... | G06F 1/203 165/104.33 |
| 6,191,943 B1 * | 2/2001 | Tracy | ............... | G06F 1/1632 361/679.46 |
| 6,239,970 B1 * | 5/2001 | Nakai | ............... | G06F 1/1616 165/185 |
| 6,711,014 B2 * | 3/2004 | Anzai | ............... | G06F 1/18 165/80.3 |
| 6,837,057 B2 * | 1/2005 | Pokharna | ............... | G06F 1/203 361/679.41 |
| 7,113,399 B2 * | 9/2006 | Hisano | ............... | H05K 7/20254 361/688 |

(Continued)

*Primary Examiner* — James Wu
*Assistant Examiner* — Michael Matey
(74) *Attorney, Agent, or Firm* — JCIPRNET

(57) ABSTRACT

An electronic assembly including a machine body and a docking station is provided. The machine body includes a casing, a heat transfer plate, and a heat dissipation fin set. The casing has a first hole and a second hole. The heat transfer plate and the heat dissipation fin set are disposed in the casing. The heat dissipation fin set includes heat dissipation fins, and a diversion portion of at least one of the heat dissipation fins is aligned to the first hole and the second hole. The docking station includes a body and a fan. The body has a third hole. The fan is disposed in the body. When the machine body is assembled to the docking station, an air flow generated by the fan flows into the casing via the third the first holes, and the air flow is divided into two flows by the diversion portion.

10 Claims, 5 Drawing Sheets

(56) References Cited

U.S. PATENT DOCUMENTS

| | | | |
|---|---|---|---|
| 2002/0105783 A1* | 8/2002 | Kitahara | G06F 1/1632 361/695 |
| 2004/0027798 A1* | 2/2004 | Fujiwara | G06F 1/1632 361/679.48 |
| 2004/0130870 A1* | 7/2004 | Fleck | G06F 1/1632 361/679.41 |
| 2006/0012955 A1* | 1/2006 | Vinson | H05K 7/20727 361/695 |
| 2006/0056151 A1* | 3/2006 | Hara | H05K 7/20145 361/696 |
| 2006/0126289 A1* | 6/2006 | Takenoshita | G06F 1/203 361/679.47 |
| 2007/0152633 A1* | 7/2007 | Lee | G06F 1/1632 320/114 |
| 2013/0148298 A1* | 6/2013 | Liu | H05K 7/20145 361/695 |
| 2017/0273214 A1* | 9/2017 | Casparian | H05K 7/20145 |

* cited by examiner

ELECTRONIC ASSEMBLY

CROSS-REFERENCE TO RELATED APPLICATION

This application claims the priority benefit of U.S. provisional application Ser. No. 62/439,470, filed on Dec. 28, 2016. The entirety of the above-mentioned patent application is hereby incorporated by reference herein and made a part of this specification.

BACKGROUND OF THE INVENTION

1. Field of the Invention

The invention relates to an electronic assembly, and particularly relates to an electronic assembly having preferable heat dissipation performance.

2. Description of Related Art

With the continuous development of science and technology, various portable electronic apparatuses, such as laptop computers, smart phones, and tablet computers, hit the market one after another. With the portable electronic apparatuses, users are able to quickly process and receive/transmit information. Thus, the portable electronic apparatuses have become an indispensable part in the modern society. Tablet computers, for example, have the advantage of being small-sized, light-weighted, and easy to carry around, making it easy to use when the users are away.

In order to keep the aforementioned advantages of the tablet computers, it is common to attach a sheet material formed of a highly thermally conductive material to a heat generating component in the tablet computer, so that heat generated by the heat generating component may be transferred to the sheet material formed of a highly thermally conductive material and then transferred to a back cover of the tablet computer, thereby discharging heat outside the tablet computer. However, when the tablet computer is operated in a high-performance mode, the heat generating component may generate a significant amount of heat, and it is difficult for a heat dissipation process described above to discharge such a greater amount of heat within a short period of time. As a result, the performance of the tablet computer is affected.

SUMMARY OF THE INVENTION

The invention provides an electronic assembly having preferable heat dissipation performance.

An electronic assembly according to an embodiment of the invention includes a machine body and a docking station. The machine body includes a casing, a heat transfer plate, and a heat dissipation fin set. The casing has a first hole and a second hole. The heat transfer plate is disposed in the casing and thermally coupled to a heat generating component. The heat dissipation fin set is disposed in the casing and thermally coupled to the heat transfer plate. The heat dissipation fin set includes a plurality of heat dissipation fins arranged in parallel, at least one of the heat dissipation fins includes a body portion and a diversion portion extending from the body portion. Moreover, the diversion portion is aligned with the first hole and the second hole. The docking station includes a body and a fan. The body has a third hole. The fan is disposed in the body. When the machine body and the docking station are assembled, the third hole is aligned to the first hole, and an air flow generated by the fan flows out of the body via the third hole and flows into the casing via the first hole. The air flow is divided into a first flow flowing away from the second hole and a second flow flowing toward the second hole by the diversion portion.

According to an embodiment of the invention, the diversion portion has a first diversion plate and a second diversion plate connected with each other, and an angle is included between the first diversion plate and the second diversion plate.

According to an embodiment of the invention, the diversion portion has a first diversion plate and a second diversion plate connected with each other, and an opening is formed between the first diversion plate and the second diversion plate. The opening faces away from the first hole.

According to an embodiment of the invention, the diversion portion has a first diversion plate and a second diversion plate connected with each other, and the diversion portion is in a V-shape.

According to an embodiment of the invention, the heat dissipation fin set further includes a base connecting the heat dissipation fins, and the base and the second hole are respectively located at two opposite sides of the heat dissipation fins.

According to an embodiment of the invention, the casing further has a first side and a second side opposite to each other and a bottom connected with the first side and the second side. The first hole is located at the second side, the second hole is located at the bottom, the heat transfer plate contacts an inner surface of the second side, and the heat transfer plate and the second hole are respectively located at two opposite sides of the first hole.

According to an embodiment of the invention, the casing further has a plurality of fourth holes. The fourth holes are located at the second side and expose portions of the heat transfer plate. The fourth holes are located above the first hole.

According to an embodiment of the invention, the body of the docking station includes a mounting portion mounting the machine body. When the machine body and the docking station are assembled, the bottom of the casing faces toward the mounting portion to form a flow channel.

According to an embodiment of the invention, the mounting portion has a ventilating hole, and the second hole is aligned to the ventilating hole.

According to an embodiment of the invention, the heat transfer plate is a vapor chamber.

Based on the above, when the machine body and the docking station according to the embodiments of the invention are assembled, the docking station may provide a heat dissipating air flow into the machine body. Besides, the heat dissipating air flow flowing into the machine body may be divided into two flows flowing in different directions. Accordingly, the convection effect and the heat dissipation efficiency are facilitated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
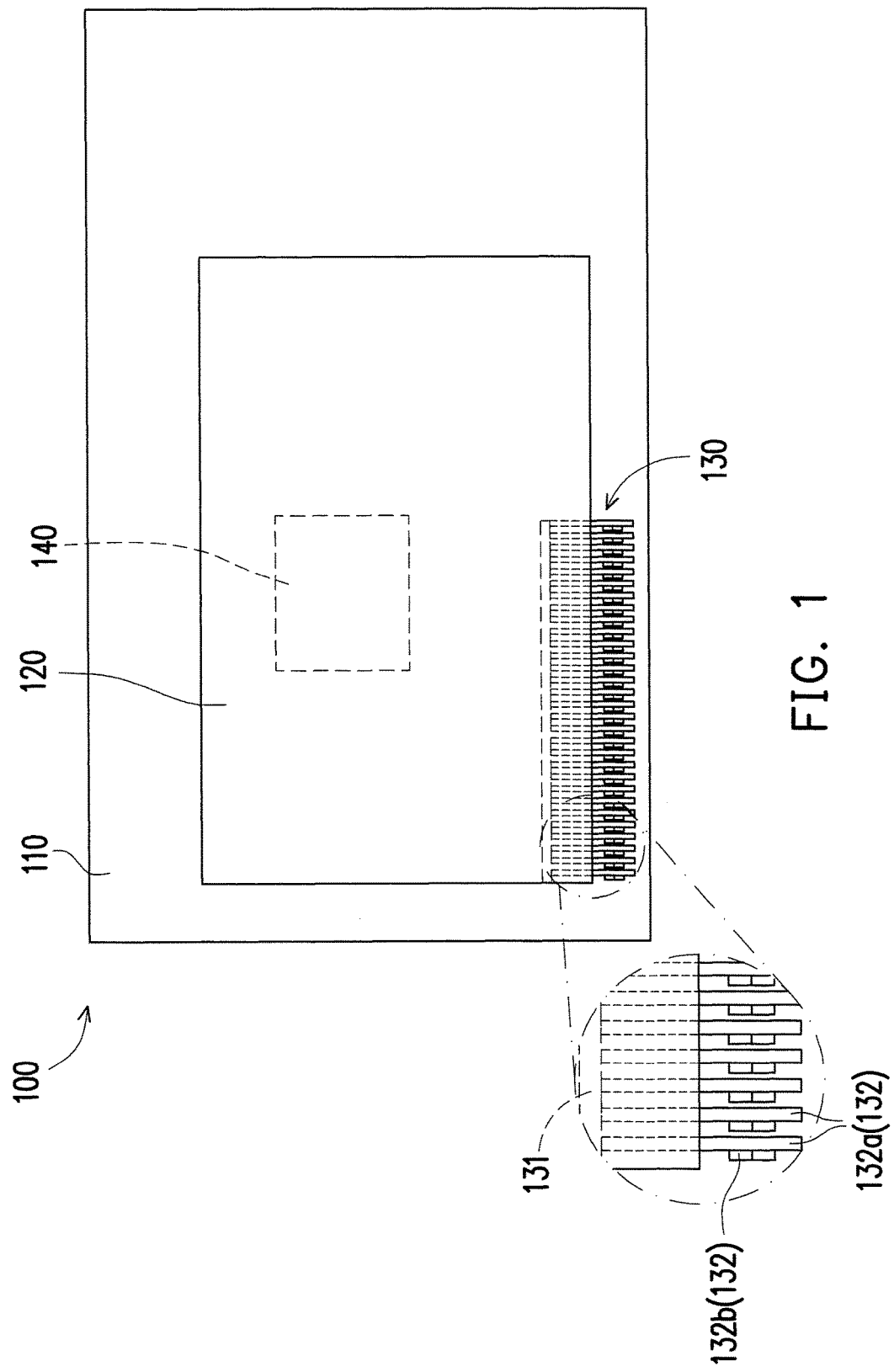
FIG. 1 is a schematic view illustrating an internal structure of a machine body according to a first embodiment of the invention.

Reference will now be made in detail to the present preferred embodiments of the invention, examples of which are illustrated in the accompanying drawings.

Wherever possible, the same reference numbers are used in the drawings and the description to refer to the same or like parts.

Figure 2:
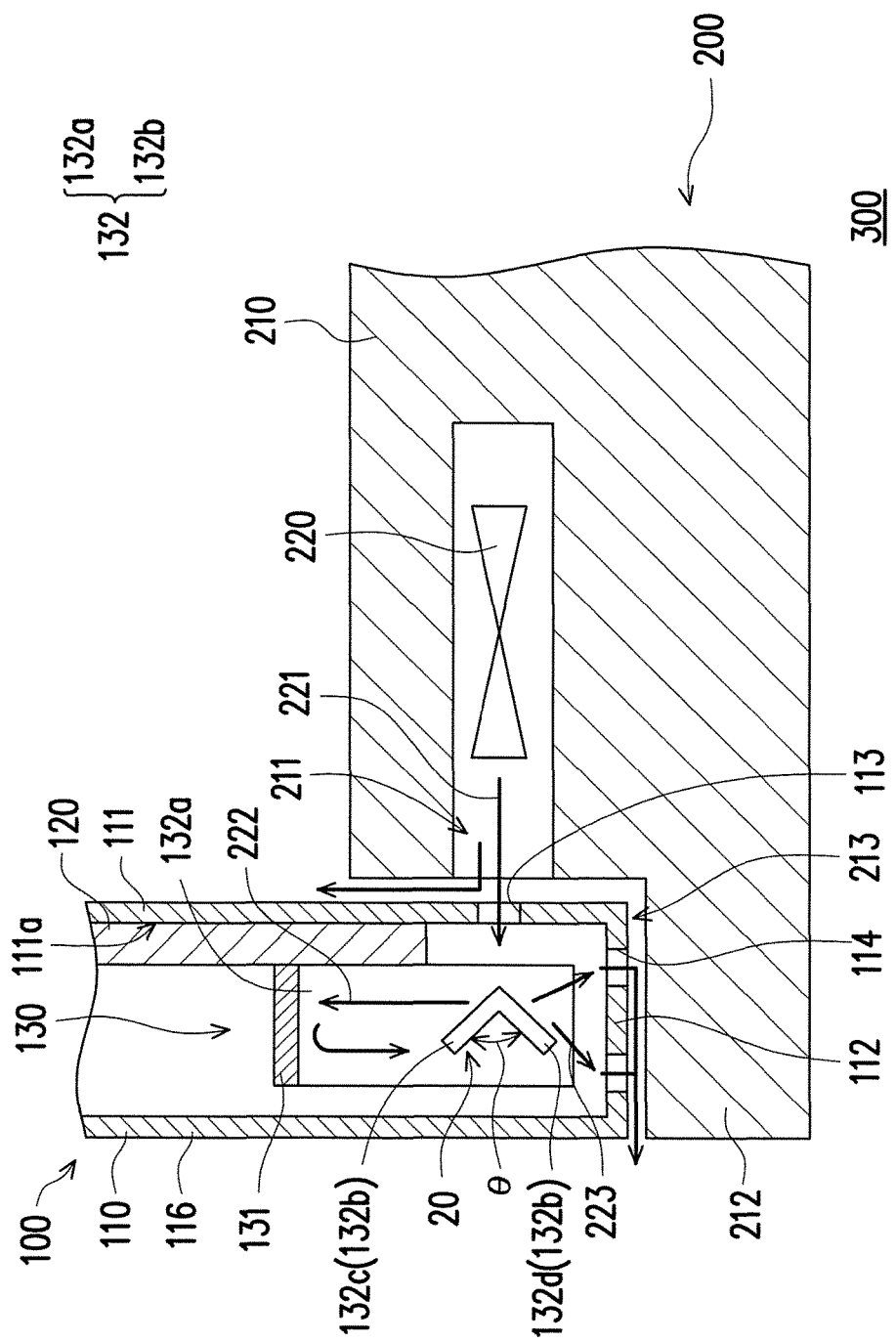
FIG. 2 is a schematic cross-sectional view illustrating a state when the machine body is assembled with a docking station according to the first embodiment of the invention.

FIG. 1 is a schematic view illustrating an internal structure of a machine body according to a first embodiment of the invention. FIG. 2 is a schematic cross-sectional view illustrating a state when the machine body is assembled with a docking station according to the first embodiment of the invention. For the clarity of illustration and ease of description, some components, such as back cover, of a machine body 100 are omitted from FIG. 1. Referring to FIGS. 1 and 2, in the embodiment, the machine body 100 is a portable electronic apparatus, such as a tablet computer. The machine body 100 includes a casing 110, a heat transfer plate 120, and a heat dissipation fin set 130. In addition, the heat transfer plate 120 and the heat dissipation fin set 130 are disposed in the casing 110, and the heat dissipation fin set 130 is thermally coupled with the heat transfer plate 120. The heat transfer plate 120 may be a vapor chamber, and is thermally coupled with a heat generating component (such as a central processing unit (CPU)) in the casing 110. Therefore, the heat generated by the heat generating component 140 during operation may be transferred to the heat transfer plate 120 and then to the heat dissipation fin set 130.

The heat dissipation fin set 130 includes a base 131 and a plurality of heat dissipation fins 132 disposed in parallel. The base 131 is configured to connect the heat dissipation fins 132, and a spacing is provided between any two adjacent heat dissipation fins 132. In the embodiment, each of the heat dissipation fins 132 includes a body portion 132a and a diversion portion 132b extending from the body portion 132a. In addition, each body portion 132a is connected with the base 131, and the diversion portion 132b is provided in the spacing between any two adjacent body portions 132a. For example, each diversion portion 132b may be formed on a surface of the corresponding body portion 132a by punching.

The casing 110 has a first side 116 and a second side 111 opposite to each other, a bottom 112 connected with the first side 116 and the second side 111, a first hole 113 and a second hole 114. In addition, the first hole 113 is located at the second side 111, and the second hole 114 is located at the bottom 112. The heat transfer plate 120 contacts an inner surface 111a of the second side 111, and the heat transfer plate 120 and the second hole 114 are respectively located at two opposite sides of the first hole 113. Besides, the base 131 and the second hole 114 are respectively located at two opposite sides of the heat dissipation fins 132.

In the embodiment, the diversion portions 132b are aligned to the first hole 113 and the second hole 114. FIG. 2 schematically illustrates an example where one of the diversion portions 132b is aligned to the first hole 113 and the second hole 114. More specifically, each diversion portion 132b has a first diversion plate 132c and a second diversion plate 132d, and an angle θ is included between the first diversion plate 132c and the second diversion plate 132d. Moreover, an opening 20 is formed at a side where the first diversion plate 132c and the second diversion plate 132d are not connected. In other words, each diversion portion 132b is substantially in a V-shape. As shown in FIG. 2, the opening 20 faces away from the first hole 113.

Referring to FIG. 2, a docking station 200 includes a body 210 and a fan 220. The body 210 has a third hole 211, and the fan 220 is disposed in the body 210. When the machine body 100 and the docking station 200 are assembled to form an electronic assembly 300, the third hole 211 is aligned to the first hole 113, and an air flow 221 generated by the fan 220 during operation flows out of the body 210 via the third hole 211 and flows into the casing 110 via the first hole 113. After the air flow 221 flows into the casing 110, the air flow 221 contacts the diversion portion 132b and is divided into a first flow 222 flowing away from the second hole 114 (or flowing toward the base 131) and a second flow 223 flowing toward the second hole 114.

More specifically, a portion of the air flow 221 contacting the first diversion plate 132c forms the first flow 222, and a portion of the air flow 221 contacting the second diversion plate 132d forms the second flow 223. The first flow 222 flowing toward the base 131 may contact most of the body portion 132a of the heat dissipation fin 132 and exchange heat with the body portion 132a to take away heat transferred to the body portion 132a. In addition, after the first flow 222 contacts the base 131, the first flow 222 may flow toward the second hole 114 and flow out of the casing 110 via the second hole 114. Besides, the second flow 223 flowing toward the second hole 114 may directly flow out of the casing 110 from the second hole 114. At this time, the first flow 222 after the heat exchange may be driven to flow toward the second hole 114 and quickly flow out of the casing 110 via the second hole 114. Therefore, a convection effect of the air flow 221 (including the first flow 222 and the second flow 223) in the casing 110 is facilitated. Hence, the electronic assembly 300 according to the embodiment of the invention has preferable heat dissipation performance.

During a process that the air flow 221 generated by the fan 220 during operation flows out of the body 210 via the third hole 221, a portion of the air flow 221 may flow toward the second side 111 of the casing 110 via a gap between the body 210 and the second side 111 of the casing 110. Since the heat transfer plate 120 contacts the inner surface 111a of the second side 111, the heat transferred to the heat transfer plate 120 may be further transferred to the second side 111 of the casing 110 and exchange heat with the second side 111 of the casing 110 via the air flow 221 flowing to the second side 111 of the casing 110, so as to take away heat transferred to the second side 111 of the casing 110.

In the embodiment, the body 210 of the docking station 200 includes a mounting portion 212 for mounting the machine body 100. When the machine body 100 is assembled with the docking station 200, the bottom 112 of the casing 110 faces toward the mounting portion 212 to form a flow channel 213. Therefore, the first flow 222 and the second flow flowing out of the casing 110 via the second hole 114 may be discharged via the flow channel 213.

Other embodiments are described in the following for further details. It should be noted that the reference numerals and a part of the contents in the previous embodiment are used in the following embodiments, in which identical reference numerals indicate identical or similar components, and repeated description of the same technical contents is omitted. For a detailed description of the omitted parts, reference can be found in the previous embodiment, and no repeated description is contained in the following embodiments.

Figure 3:
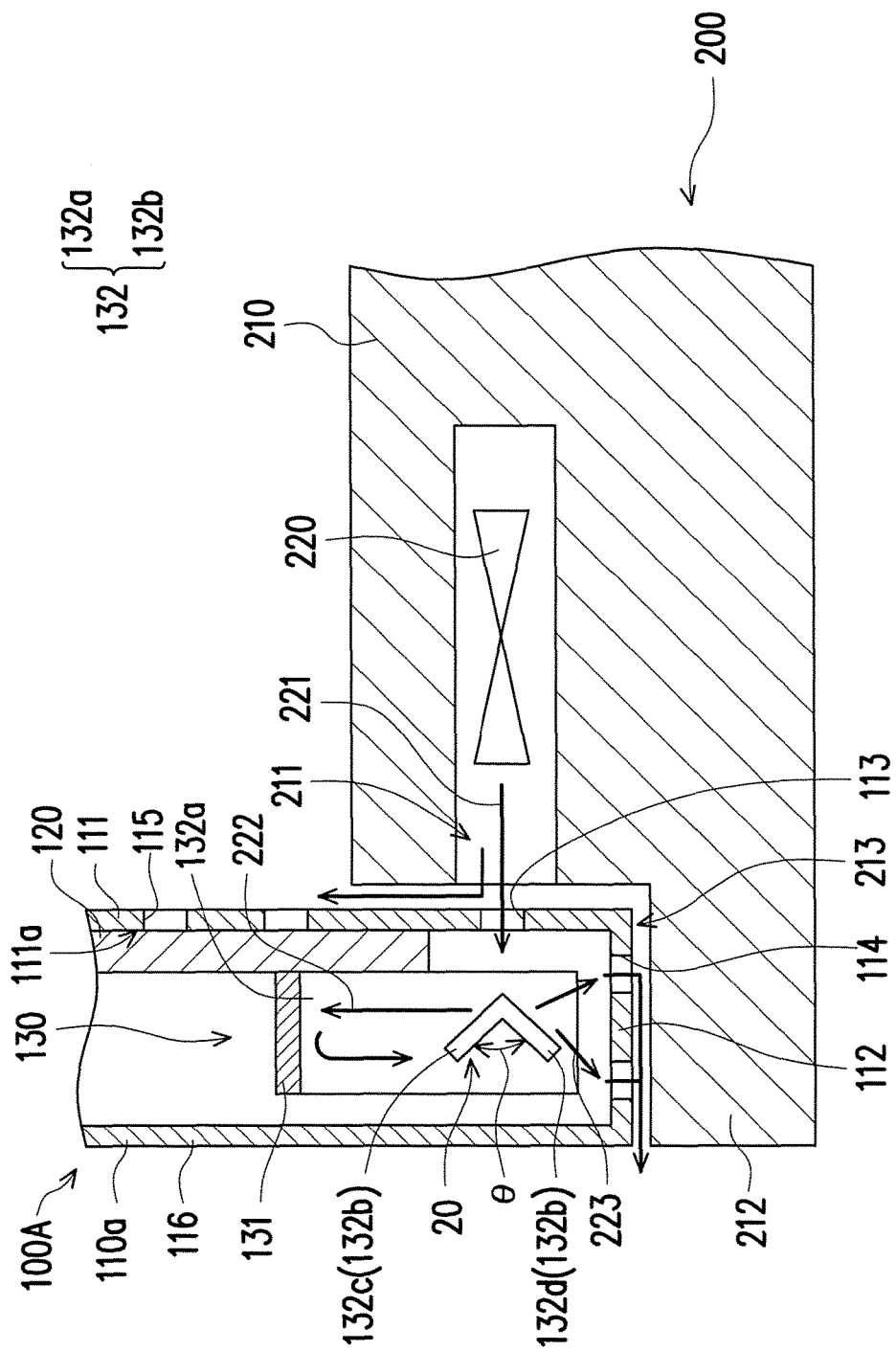
FIG. 3 is a schematic cross-sectional view illustrating a state when a machine body is assembled with a docking station according to a second embodiment of the invention.

FIG. 3 is a schematic cross-sectional view illustrating a state when a machine body is assembled with a docking station according to a second embodiment of the invention. Referring to FIG. 3, a machine body 100A of the embodiment slightly differs from the machine body 100 of the first embodiment in that a casing 100a of the machine body 100A has a plurality of fourth holes 115. The fourth holes 115 are located at the second side 111 of the casing 110a and expose portions of the heat transfer plate 120. To be more specific, the fourth holes 115 are located above the first hole 113. The air flow 221 flowing to the second side 111 of the casing 110a via the gap between the body 210 and the second side 111 of the casing 110a may exchange heat with the second side 111 of the casing 110a and the portions of the heat transfer plate 120 exposed by the fourth holes 115 to take away heat transferred to the second side 111 of the casing 110a and heat transferred to the heat transfer plate 120.

Figure 4:
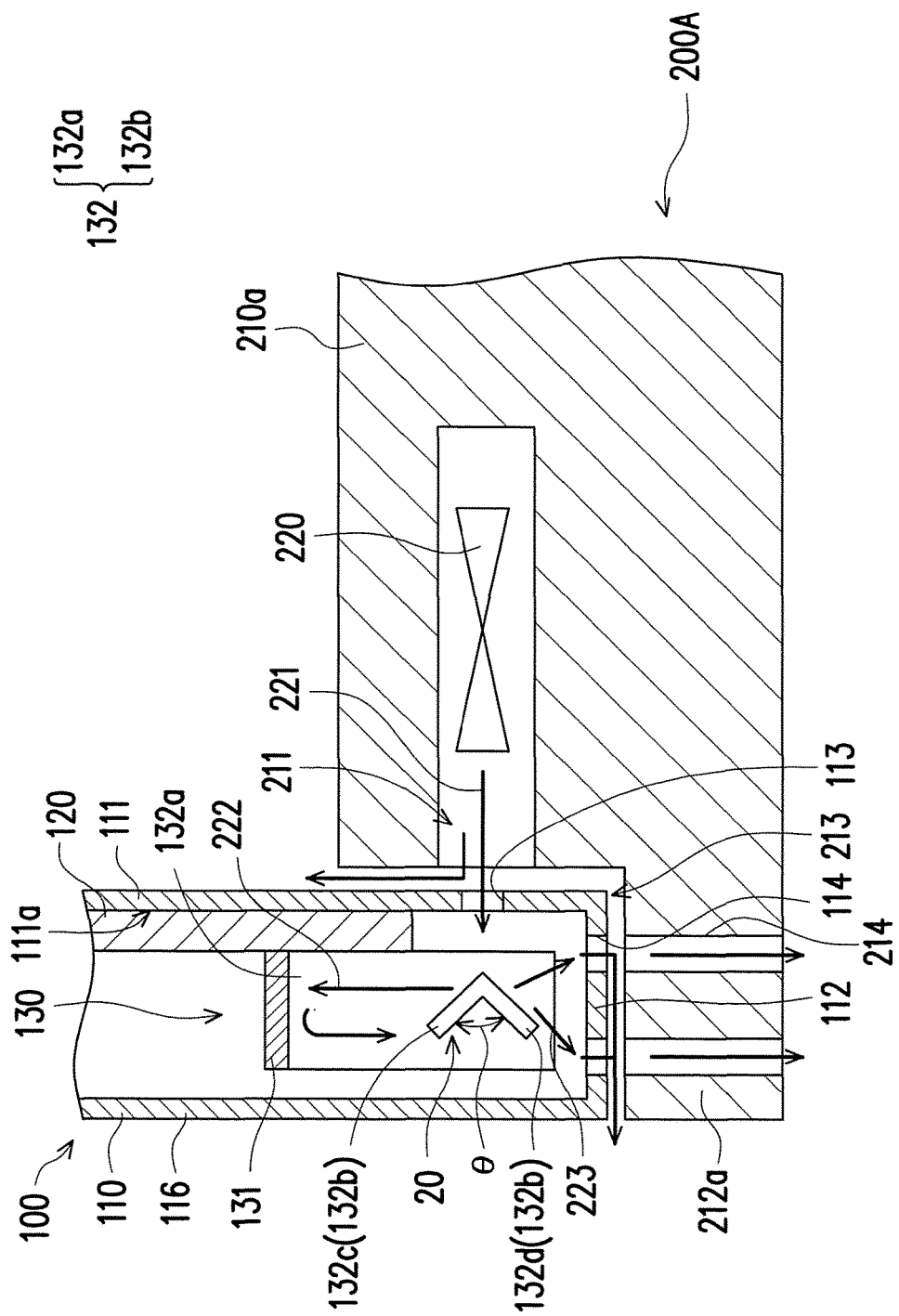
FIG. 4 is a schematic cross-sectional view illustrating a state when a machine body is assembled with a docking station according to a third embodiment of the invention.

FIG. 4 is a schematic cross-sectional view illustrating a state when a machine body is assembled with a docking station according to a third embodiment of the invention. Referring to FIG. 3, a docking station 200A of the embodiment slightly differs from the docking station 200 of the first embodiment in that a mounting portion 212a of a body 210a of the docking station 200A has a ventilating hole 214, and the second hole 114 is aligned to the ventilating hole 214. The ventilating hole 214 penetrates the mounting portion 212a. Therefore, the first flow 222 and the second flow 223 flowing out of the casing 110 through the second hole 114 may be discharged via the flow channel 213 or via the ventilating hole 214.

Figure 5:
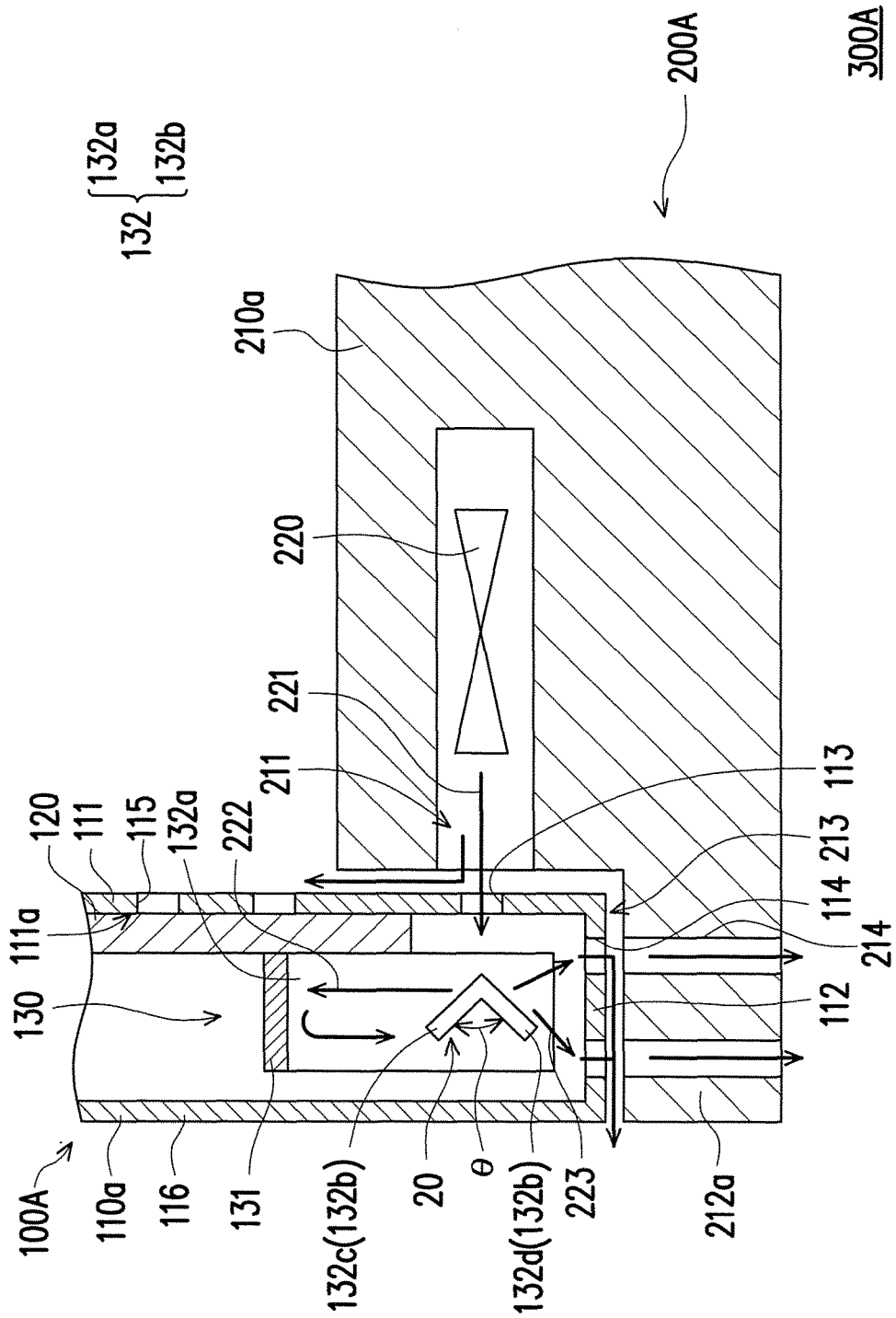
FIG. 5 is a schematic cross-sectional view illustrating a state when a machine body is assembled with a docking station according to a fourth embodiment of the invention.

FIG. 5 is a schematic cross-sectional view illustrating a state when a machine body is assembled with a docking station according to a fourth embodiment of the invention. Referring to FIG. 5, an electronic assembly 300A of the embodiment is a combination of the machine body 100A of the second embodiment and the docking station 200A of the third embodiment. In other words, in the embodiment, the casing 110a of the machine body 100A has the fourth holes 115. The fourth holes 115 are located at the second side 111 of the casing 110a and expose portions of the heat transfer plate 120. To be more specific, the fourth holes 115 are located above the first hole 113. The air flow 221 flowing to the second side 111 of the casing 110a via the gap between the body 210a and the second side 111 of the casing 110a may exchange heat with the second side 111 of the casing 110a and the portions of the heat transfer plate 120 exposed by the fourth holes 115 to take away heat transferred to the second side 111 of the casing 110a and heat transferred to the heat transfer plate 120.

Besides, the body 210a of the docking station 200A has the ventilating hole 214, and the second hole 114 is aligned to the ventilating hole 214. The ventilating hole 214 penetrates the mounting portion 212a. Therefore, the first flow 222 and the second flow 223 flowing out of the casing 110a via the second hole 114 may be discharged via the flow channel 213 or via the ventilating hole 214.

In view of the foregoing, when the machine body and the docking station according to the embodiments of the invention are assembled, the docking station may provide a heat dissipating air flow into the machine body through a fan. Besides, the heat dissipating air flow flowing into the machine body may be divided into two flows flowing in different directions by the diversion portion on the heat dissipation fin. One of the flows exchanges heat with the heat dissipation fin, and the other of the flows out of the machine body. Accordingly, the convection effect and the heat dissipation efficiency are facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic assembly, comprising:
a machine body, comprising:
a casing, having a first hole and a second hole;
a heat transfer plate, disposed in the casing and thermally coupled to a heat generating component; and
a heat dissipation fin set, disposed in the casing and thermally coupled to the heat transfer plate, wherein the heat dissipation fin set comprises a plurality of heat dissipation fins arranged in parallel, at least one of the heat dissipation fins comprises a body portion and a diversion portion extending from the body portion, and the diversion portion is aligned with the first hole and the second hole; and
a docking station, comprising:
a body, having a third hole; and
a fan, disposed in the body, wherein when the machine body and the docking station are assembled, the third hole is aligned to the first hole, an air flow generated by the fan during operation flows out of the body via the third hole and flows into the casing via the first hole, and the air flow is divided into a first flow flowing away from the second hole and a second flow flowing toward the second hole by the diversion portion.

2. The electronic assembly as claimed in claim 1, wherein the diversion portion has a first diversion plate and a second diversion plate connected with each other, and an angle is included between the first diversion plate and the second diversion plate.

3. The electronic assembly as claimed in claim 1, wherein the diversion portion has a first diversion plate and a second diversion plate connected with each other, and an opening facing away from the first hole is formed between the first diversion plate and the second diversion plate.

4. The electronic assembly as claimed in claim 1, wherein the diversion portion has a first diversion plate and a second diversion plate connected with each other, and the diversion portion is in a V-shape.

5. The electronic assembly as claimed in claim 1, wherein the heat dissipation fin set further comprises a base connecting the heat dissipation fins, and the base and the second hole are respectively located at two opposite sides of the heat dissipation fins.

6. The electronic assembly as claimed in claim 1, wherein the casing further has a first side and a second side opposite to each other and a bottom connected with the first side and the second side, the first hole is located at the second side, the second hole is located at the bottom, the heat transfer plate contacts an inner surface of the second side, and the heat transfer plate and the second hole are respectively located at two opposite sides of the first hole.

7. The electronic assembly as claimed in claim 6, wherein the casing further has a plurality of fourth holes located at the second side and exposing portions of the heat transfer plate, and the fourth holes are located above the first hole.

8. The electronic assembly as claimed in claim 6, wherein the body of the docking station comprises a mounting portion mounting the machine body, and when the machine body and the docking station are assembled, the bottom of the casing faces toward the mounting portion to form a flow channel.

9. The electronic assembly as claimed in claim 8, wherein the mounting portion has a ventilating hole, and the second hole is aligned to the ventilating hole.

10. The electronic assembly as claimed in claim 1, wherein the heat transfer plate is a vapor chamber.

\* \* \* \* \*